United States Patent [19]

Marwell et al.

[11] 4,001,688
[45] Jan. 4, 1977

[54] COULOMETER WITH END OF INTEGRATION COLOR CHANGE INDICATOR

[75] Inventors: Edward M. Marwell, Mount Kisco; Jack C. Loh, White Plains, both of N.Y.

[73] Assignee: Curtis Instruments, Inc., Mount Kisco, N.Y.

[22] Filed: Feb. 13, 1976

[21] Appl. No.: 657,953

Related U.S. Application Data

[63] Continuation of Ser. No. 473,713, May 28, 1974, abandoned.

[52] U.S. Cl. .................................. 324/182; 73/71.4
[51] Int. Cl.² ........................................... G04F 8/00
[58] Field of Search ............ 324/181, 182; 73/71.4

[56] References Cited

UNITED STATES PATENTS

| | | | |
|---|---|---|---|
| 2,769,929 | 11/1956 | Hardway | 73/71.4 |
| 3,431,414 | 3/1969 | Bate et al. | 324/182 |
| 3,593,048 | 7/1971 | Dunegan | 73/71.4 |
| 3,628,143 | 12/1971 | Di Paola | 324/182 |
| 3,665,308 | 5/1972 | Beusman | 324/182 |

*Primary Examiner*—Robert Segal
*Assistant Examiner*—Michael J. Tokar
*Attorney, Agent, or Firm*—Pennie & Edmonds

[57] ABSTRACT

A coulometer signaling device is disclosed which indicates when a particular machine has been used for a predetermined amount of time. The device comprises a mercury coulometer which includes an electrolyte whose color changes when the mercury deposited on the anode of the coulometer has been depleted. The end of the tube near the coulometer is somewhat enlarged and a lens is placed over this end in order to make the color change more visible.

10 Claims, 5 Drawing Figures

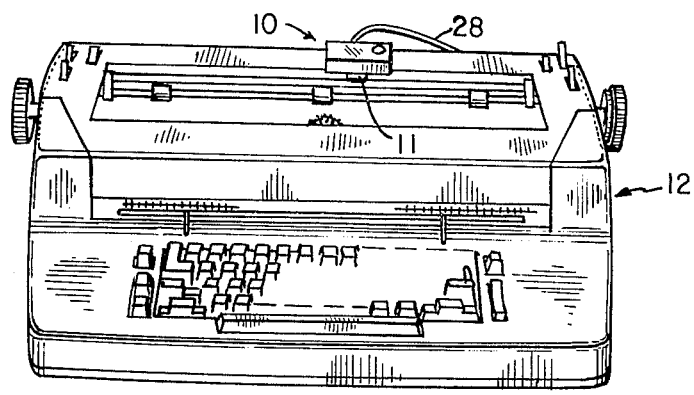
FIG. 1
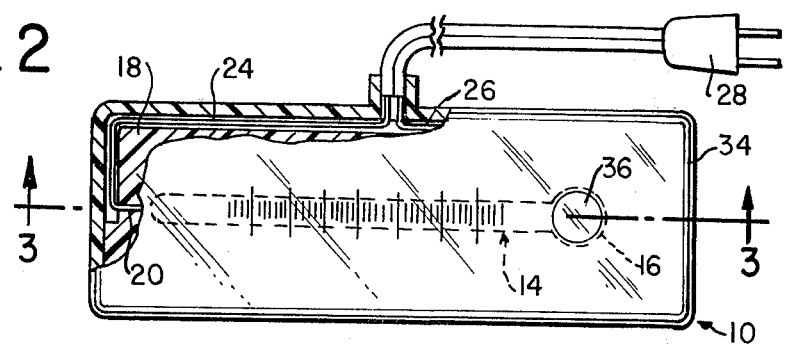
FIG. 2
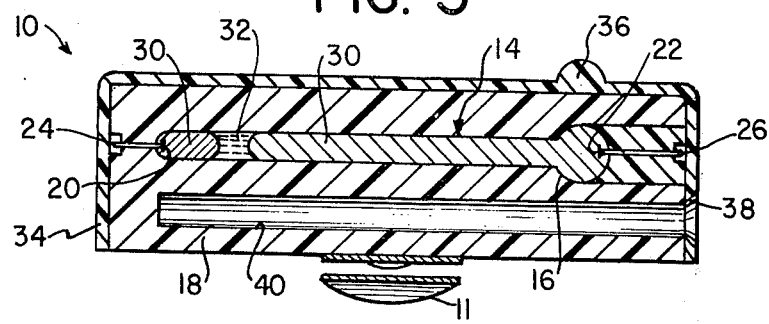
FIG. 3
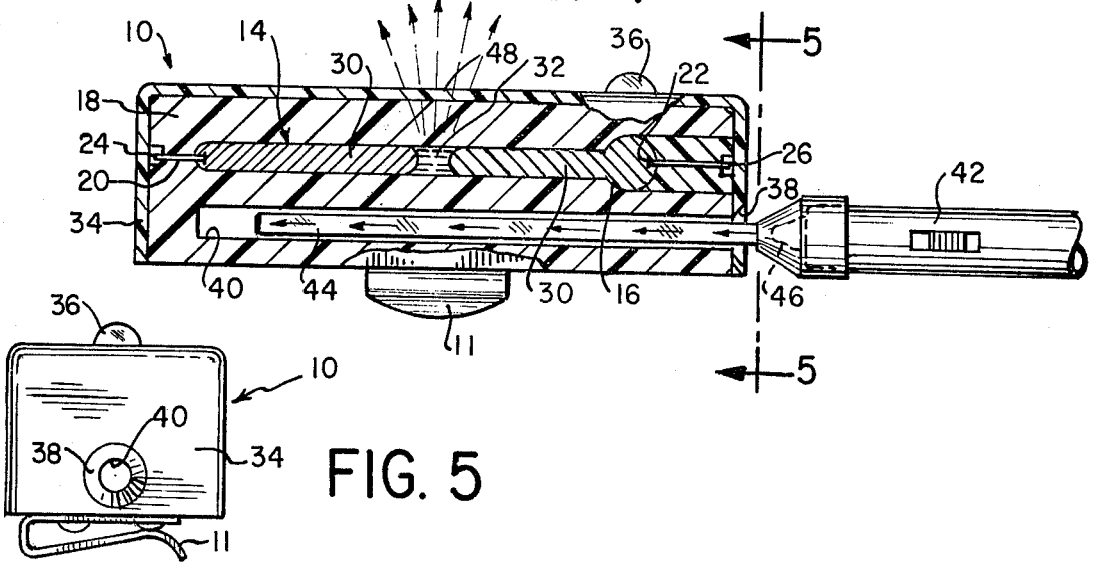
FIG. 4
FIG. 5

COULOMETER WITH END OF INTEGRATION COLOR CHANGE INDICATOR

This is a continuaion of application Ser. No. 473,713, filed May 28, 1974 now abandoned.

BACKGROUND OF THE INVENTION

The present invention relates to electrochemical devices known as coulometers and more specifically to a coulometer-type instrument that is capable of measuring and indicating periods of use by integrating the total electric current that has been conducted through an electrical circuit.

Coulometers are described in detail in Lester Corrsin's U.S. Pat. No. Re, 27,556 entitled "Operating Time Indicator" and Curtis Beusman's U.S. Pat. No. 3,193,763 entitled "Electrolytic Coulometric Current Integrating Device", both of which are incorporated herein by reference.

The device described in these patents includes a tubular body of nonconductive material having a bore therethrough that supports two columns of a liquid metal such as mercury. The adjacent innermost ends of these columns are separated by a small volume of electrolyte with which they make conductive contact. The outermost ends of the liquid metal columns contact conductive leads that connect the instrument to the source of electric current that is to be measured. In accordance with Faraday's Law, when current flows through the instrument, liquid metal is electroplated from the anode column on to the cathode column causing the anode to decrease in length and the cathode to increase an equal amount, the change in column length being directly proportional to the total electric charge passed through the instrument.

Readout of the total current through the instrument may be made by comparing the length of a column against a calibrated scale. Typical visual readout devices are described in the above-identified Corrsin patent and in Beusman's U.S. Pat. No. 3,343,083 entitled "Nonself-Destructive Reversible Electrochemical Coulometer".

SUMMARY OF THE INVENTION

The present invention is concerned with a coulometer particularly useful for indicating when an item of equipment has been in service for a predetermined length of time. In an illustrative embodiment of the invention, such indication is made by the appearance of a red coloring on the indicating face of the coulometer when the mercury column at the anode is fully depleted. It is contemplated that the coulometer will be useful in facilitating the regular maintenance of various items of equipment and machinery such as a common office typewriter. However, it is understood that the unit could be used in conjunction with any other machine requiring attention after a predetermined period of use.

The coulometer is coupled to any DC source in the machine which is activated whenever the machine is on. Thus, the length of the mercury column in the coulometer is proportional to the time the equipment has been in operation since the coulometer was installed. If there is no DC source in the equipment, the coulometer may be put in series with a common solid state rectifier and then the combination of the rectifier and the coulometer put across an AC source. Additionally, it may be desirable, in some applications, to add a resistor in series with the coulometer in order to limit the current through the coulometer and thus increase the length of the time period which would be measured by the coulometer.

The coulometer is also provided with means for allowing a serviceman to inspect it to determine the length of the mercury column and therefor the period of use of the machine to which the coulometer is attached. Thus, if the coulometer on one of a number of machines indicates the characteristic red color, and a serviceman is called to give the machine its periodic maintenance, he may check the coulometers in the other machines at the same location to determine whether any of them will need service soon. In this case, it may be more convenient for him to service the machine immediately rather than wait for its coulometer to give the red signal. This would obviate his need to return on another occasion.

The coulometer of the present invention comprises an elongated sealed tube with electrodes disposed on each of its ends. Inside the coulometer is the usual column of mercury in contact with the anode electrode. A small amount of electrolyte liquid fills the space between the mercury column and the cathode. As current is sent through the coulometer, the mercury is transferred to the cathode. The end of the elongted tube which supports the anode terminates in a globe. The elongated tube is supported underneath a housing that may be opaque except for a transparent region directly over the coulometer. At one end of the coulometer, this transparent region is shaped to form a lens disposed over the globe. Alternatively, the coulometer may be supported in a groove in the housing and provided with a separate lens.

As electric current passes through the coulometer, the plating of mercury from the column adjacent the anodes forms a column adjacent the cathode and causes the liquid electrolyte to migrate toward the globe. As the liquid electrolyte fills the globe, the anode runs out of mercury to transfer to the cathode. The electrolyte itself then undergoes a chemical change in response to the application of the current through the coulometer. This chemical change results in turning the electrolyte red in color. This color change is seen through the lens by the operator of the machine and indicates to him that the machine is in need of service.

A passage accessible from the exterior of the coulometer is provided underneath the elongated coulometer tube. If it is desired to check a machine whose indicator has not changed color, a light rod is inserted in this passage and the light escaping from the rod out of the passage and through the electrolyte appears as a dot whose position is a measure of the accumulated time during which the machine has been in use. Naturally, if the position of the dot is very close to the globe on the coulometer, this would indicate that the predetermined time will soon elapse and that it might therefore be appropriate to service the machine.

BRIEF DESCRIPTION OF THE DRAWINGS

FIG. 1 is a perspective view of a typewriter provided with the coulometer of the present invention;

FIG. 2 is a plan view of a coulometer constructed in accordance with the present invention;

FIG. 3 is a cross-sectional view along lines 3—3 of FIG. 2;

FIG. 4 is a cross-sectional view of the coulometer of the present invention with the light pen inserted into it; and FIG. 5 is a view along lines 5—5 of FIG. 4.

DETAILED DESCRIPTION OF THE PREFERRED EMBODIMENT

Referring to FIG. 1, a coulometer 10, constructed in accordance with the present invention, is illustrated. The coulometer 10 includes a clip 11, which enables it to be secured to a typewriter 12. Any other conventional means may be used to secure the coulometer to the typewriter such as an adhesive or a magnet. As illustrated most clearly in FIGS. 2 and 3, the coulometer 10 includes a coulometer tube 14. The coulometer tube terminates in an enlarged globe 16. Coulometer 14 is supported by a support block 18 which may be made of plastic or any other suitable material. In the preferred embodiment, support block 18 is made of a material which is transparent although it may be made of translucent material.

A pair of electrodes 20 and 22 are connected via wires 24 and 26 to a connector 28 which plugs into a mating connector (not shown) on the typewriter which has been electrically connected to a DC source in the machine. Any electrical terminal in the machine that has a voltage on it whenever the machine is on is a suitable source. Alternatively, if there are no DC voltages present in the machine, the mating connector may be connected in series with a diode and an AC source. It may also be desirable to connect a metering resistor in series with the coulometer. The value of the series resistance would be varied in accordance with the amount of time which one would desire to elapse before the coulometer shows its characteristic red color. The larger the resistance, the longer that period of time will be.

The coulometer tube 14 is filled with a quantity of mercury 30 and an electrolyte 32. The volume of electrolyte is approximately equal to the volume of globe 16. Before operation is initiated, most or all of the mercury would be concentrated in a column in contact with electrode 22. In the preferred embodiment, support block 18 is housed by a translucent housing 34 which may be made of any suitable material such as translucent plastic or the like. If desired, clip 11 may be made integral with the housing, or a separate clip may be attached to the support block as illustrated in FIG. 5. Housing 34 is also provided with a lens 36 for presenting a magnified view of the globe 16. Alternatively, the housing could be made of a transparent material and the lens made integral with it. During operation, an electrical signal coupled by plug 28 causes the electrolyte 32 to migrate toward the globe. Then, after a predetermined amount of time has elapsed in the operation of the typewriter 12, the electrolyte reaches the globe and fills it and a chemical change is caused in electrolyte 32 while it is in globe 16. The chemical change turns the electrolyte red. This results in the appearance of a red color through convex lens 36.

The red color is achieved by adding a chemical to the coulometer electrolyte. This chemical is inactive during electrolysis between two mercury electrodes. However, when the mercury is completely deplated from the anode, then this added chemical undergoes a redox reaction at the electrodes which results in a change that can easily be identified visually.

Although a number of chemicals will work satisfactorily, in the preferred embodiment an amount of triiodide ions are added to the mercuric iodide—potassium iodide electrolyte. Either potassium triiodide or iodine added to potassium iodide can be used for this purpose. The concentrations of chemicals used may vary over quite a large range, however a typical electrolyte solution might comprise a 7 molar concentration of potassium iodide and equal molar concentrations of mercuric iodide and potassium triiodide in the range between 0.5 to 2 moles in water or an organic fluid. The high concentration of potassium iodide has the added advantage of lowering the freezing point of the electrolyte and thus allowing operation at extreme temperatures. The triiodide ions in the electrolyte do not undergo electrolysis between mercury electrodes. However, when mercury is completely deplated from the planar electrode, then the triiodide ions undergo the following reaction at the cathode:

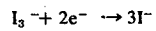

At the anode, the reaction is:

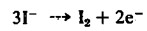

Finally, the overall reaction in the gap is:

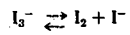

The generation of the reddish brown iodine at the anode causes the electrolyte color to change from clear to reddish brown when the mercury is completely deplated from the electrode. This color change can be visually identified and is magnified by the lens. The area around the lens may be contrastingly colored, thereby providing a most easily identifiable signal when the preselected integral has been completed.

Housing 34 is also provided with a hole 38. Support block 18 is provided with a passage 40. As can be seen most clearly in FIG. 4, when it is desired to determine whether a significant portion of the predetermined period of operation has elapsed, a light pen 42 having a long light emitting member 44 is used. Member 44 is inserted through hole 38 into passage 40. Light emitting member 44 may be made of any material with a high index of refraction. The surface of the material may also be eroded or roughened to degrade the quality of internal reflections within the flexible member and thus increase the amount of light emitted from the surface. Light is sent to the member via a lamp 46 in light pen 42. Light emitted by member 44 exits through the electrolyte 32 but not through the mercury 30 in the coulometer tube 14. This results in the appearance of a bright spot of light at a small point 48 on the surface of coulometer housing 34. Naturally, the distance between lens 36 and the bright spot at point 48 is a measure of the amount of time remaining before the machine requires additional service and will indicate to the serviceman whether service at a given point in time is economically justified.

It is thus seen that a relatively economic and easy to use device is provided for monitoring the use of a machine. Of course, it is understood that various changes and modifications of the disclosed device will be obvious to those skilled in the art, and it is contemplated that such changes are within the scope of the invention which is limited only by the appended claims.

We claim:

1. In a coulometric device comprising a body of nonconductive material having a capillary bore therein, a liquid metal disposed within said bore and an electrolyte for dividing said liquid metal into two columns within said bore, and a pair of electrical contact means each in ohmic contact with one of said two columns for enabling the application of a potential difference between the two columns to effect the electroplating of liquid metal from one of said columns to the other of said columns, the improvement wherein said electrolyte contains a component which is inactive during electroplating of said liquid metal and which undergoes a redox reaction when the liquid metal is depleted from one of the columns, said redox reaction resulting in a visually detectable change in the color of the electrolyte and wherein at least a portion of said body is translucent whereby a change in the color of the electrolyte may be observed.

2. A coulometric device according to claim 1 wherein the portion of the bore adjacent one of said electrical contact means is enlarged and the body encompassing said enlarged portion of the bore is configured to facilitate the inspection of the electrolyte or liquid metal occupying said enlarged portion of said bore.

3. A coulometric device according to claim 1 further comprising a housing for said device, said housing having a passage therein adjacent the translucent portion of said body and opening to the exterior of the housing, said passage being adapted and arranged to permit the insertion of a light emitting member, thereby enabling illumination of the contents of said bore.

4. A coulometric device according to claim 1 wherein the electrolyte comprises a solution of mercuric iodide, potassium iodide and potassium triiodide.

5. A coulometric device according to claim 1 wherein said electrolyte contains between 3.5 and 14 parts of potassium iodide for each part of mercuric iodide and wherein the amount of potassium triiodide is on the same order of magnitude as the amount of potassium iodide.

6. A coulometric device according to claim 1 wherein said electrolyte is an aqueous solution.

7. A coulometric device according to claim 6 further comprising support means for mounting said coulometric device on a machine whose use is being monitored.

8. A coulometric device, according to claim 4, wherein said solution is an aqueous solution.

9. A coulometric device, according to claim 4, wherein said solution is an organic fluid.

10. A coulometric device, according to claim 1, wherein said electrolyte is an organic fluid.

* * * * *